US011424208B2

(12) United States Patent
Liu

(10) Patent No.: US 11,424,208 B2
(45) Date of Patent: Aug. 23, 2022

(54) SEMICONDUCTOR DEVICES HAVING ADJOINED VIA STRUCTURES FORMED BY BONDING AND METHODS FOR FORMING THE SAME

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 249 days.

(21) Appl. No.: 16/727,885

(22) Filed: Dec. 26, 2019

(65) Prior Publication Data
US 2021/0134748 A1 May 6, 2021

Related U.S. Application Data

(63) Continuation of application No. PCT/CN2019/115562, filed on Nov. 5, 2019.

(51) Int. Cl.
H01L 23/00 (2006.01)
H01L 21/768 (2006.01)
(Continued)

(52) U.S. Cl.
CPC ........ H01L 24/09 (2013.01); H01L 21/76898 (2013.01); H01L 23/481 (2013.01);
(Continued)

(58) Field of Classification Search
None
See application file for complete search history.

(56) References Cited

U.S. PATENT DOCUMENTS 10,269,684 B2   4/2019  Tsai et al.
2018/0005940 A1 1/2018  Chen et al.
(Continued)

FOREIGN PATENT DOCUMENTS

CN  108140559 A   6/2018
CN  109219885 A   1/2019
(Continued)

OTHER PUBLICATIONS

International Search Report issued in corresponding International Application No. PCT/CN2019/115562, dated Aug. 3, 2020, 5 pages.

Primary Examiner — Michelle Mandala
(74) Attorney, Agent, or Firm — Bayes PLLC

(57) ABSTRACT

Embodiments of semiconductor devices and fabrication methods thereof are disclosed. In an example, a semiconductor device includes a first semiconductor structure and a second semiconductor structure. The first semiconductor structure includes a first bonding layer having a plurality of first bonding contacts, and a first via structure extending vertically through the first bonding layer and into the first semiconductor structure. The second semiconductor structure includes a second bonding layer having a plurality of second bonding contacts, and a second via structure extending vertically through the second bonding layer and into the second semiconductor structure. The first bonding contacts are in contact with the second bonding contacts at the bonding interface, the first via structure is in contact with the second via structure, and sidewalls of the first via structure and the second via structures have a staggered profile at the bonding interface.

20 Claims, 13 Drawing Sheets

(51) Int. Cl.
*H01L 23/48* (2006.01)
*H01L 25/065* (2006.01)
*H01L 25/18* (2006.01)
*H01L 25/00* (2006.01)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); H01L 2224/08146 (2013.01); H01L 2224/09181 (2013.01); H01L 2224/80895 (2013.01); H01L 2224/80896 (2013.01); H01L 2224/80905 (2013.01); H01L 2225/06544 (2013.01)

(56) References Cited

U.S. PATENT DOCUMENTS

2020/0058617 A1* 2/2020 Wu ..................... H01L 24/83
2020/0303311 A1* 9/2020 Young ................. H01L 24/83

FOREIGN PATENT DOCUMENTS

| CN | 109417075 A | 3/2019 |
| CN | 109643700 A | 4/2019 |
| CN | 109891582 A | 6/2019 |
| CN | 110010628 A | 7/2019 |
| CN | 110192269 A | 8/2019 |
| TW | 201933593 A | 8/2019 |

\* cited by examiner

500

```
┌─────────────────────────────────────────────────────────────┐
│ FORM A FIRST SEMICONDUCTOR STRUCTURE AND A SECOND           │
│ SEMICONDUCTOR STRUCTURE, THE FIRST SEMICONDUCTOR            │
│ STRUCTURE HAVING ONE OR MORE FIRST VIA STRUCTURES AND A     │──502
│ FIRST BONDING LAYER WITH A PLURALITY OF FIRST BONDING       │
│ CONTACTS EXPOSED ON A TOP SURFACE OF THE FIRST              │
│ SEMICONDUCTOR STRUCTURE, THE SECOND SEMICONDUCTOR           │
│ STRUCTURE HAVING FIRST PORTIONS OF ONE OR MORE SECOND       │
│ VIA STRUCTURES AND A SECOND BONDING LAYER WITH A            │
│ PLURALITY OF SECOND BONDING CONTACTS EXPOSED ON A TOP       │
│ SURFACE OF THE SECOND SEMICONDUCTOR STRUCTURE               │
└─────────────────────────────────────────────────────────────┘
                              │
                              ▼
┌─────────────────────────────────────────────────────────────┐
│ ALIGN AND BOND THE FIRST AND SECOND BONDING CONTACTS TO     │
│ BOND THE FIRST SEMICONDUCTOR STRUCTURE AND THE SECOND       │──504
│ SEMICONDUCTOR STRUCTURE IN A FACE-TO-FACE MANNER TO         │
│ FORM A FIRST BONDING INTERFACE BETWEEN THE FIRST AND        │
│ SECOND BONDING LAYERS                                       │
└─────────────────────────────────────────────────────────────┘
                              │
                              ▼
┌─────────────────────────────────────────────────────────────┐
│ THIN A SUBSTRATE OF SECOND SEMICONDUCTOR STRUCTURE TO       │
│ EXPOSE THE FIRST PORTIONS OF SECOND VIA STRUCTURES AND      │──506
│ FORM A FIRST SEMICONDUCTOR LAYER                            │
└─────────────────────────────────────────────────────────────┘
                              │
                              ▼
┌─────────────────────────────────────────────────────────────┐
│ FORM A THIRD SEMICONDUCTOR STRUCTURE HAVING ONE OR          │
│ MORE THIRD VIA STRUCTURES AND A THIRD BONDING LAYER         │──508
│ HAVING A PLURALITY OF THIRD BONDING CONTACTS EXPOSED ON     │
│ A TOP SURFACE OF THE THIRD SEMICONDUCTOR STRUCTURE          │
└─────────────────────────────────────────────────────────────┘
                              │
                              ▼
                             510
```

SEMICONDUCTOR DEVICES HAVING ADJOINED VIA STRUCTURES FORMED BY BONDING AND METHODS FOR FORMING THE SAME

CROSS-REFERENCE TO RELATED APPLICATIONS

This application is continuation of International Application No. PCT/CN2019/115562, filed on Nov. 5, 2019, entitled "SEMICONDUCTOR DEVICES HAVING ADJOINED VIA STRUCTURES FORMED BY BONDING AND METHODS FOR FORMING THE SAME," which is hereby incorporated by reference in its entirety.

BACKGROUND

Embodiments of the present disclosure relate to semiconductor devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of semiconductor devices and fabrication methods thereof are disclosed herein.

In one example, a semiconductor device includes a first semiconductor structure and a second semiconductor structure. The first semiconductor structure includes a first bonding layer having a plurality of first bonding contacts, and a first via structure extending vertically through the first bonding layer and into the first semiconductor structure. The second semiconductor structure includes a second bonding layer comprising a plurality of second bonding contacts, and a second via structure extending vertically through the second bonding layer and into the second semiconductor structure. The semiconductor device also includes a bonding interface between the first bonding layer and the second bonding layer. The first bonding contacts are in contact with the second bonding contacts at the bonding interface, the first via structure is in contact with the second via structure, and sidewalls of the first via structure and the second via structures have a staggered profile at the bonding interface.

In another example, a 3D memory device includes a first semiconductor structure and a second semiconductor structure. The first semiconductor includes a first memory stack, a plurality of first NAND memory strings extending through the first memory stack, a first bonding layer having a plurality of first bonding contacts, and a first via structure extending vertically through the first bonding layer and into the first semiconductor structure. The second semiconductor structure includes a second memory stack, a plurality of second NAND memory strings extending through the first memory stack, a second bonding layer having a plurality of second bonding contacts, and a second via structure extending vertically through the second bonding layer and into the second semiconductor structure. The 3D memory device also includes a bonding interface between the first bonding layer and the second bonding layer. The first bonding contacts are in contact with the second bonding contacts at the bonding interface, and the first via structure is in contact with the second via structure and sidewalls of the first via structure and the second via structures have a staggered profile at the bonding interface.

In still another example, a method for forming a semiconductor structure includes the following operations. First, a first semiconductor structure and a second semiconductor structure are formed. The first semiconductor structure includes a first via structure and a first bonding layer with a plurality of first bonding contacts, and the second semiconductor structure includes a portion of a second via structure and a second bonding layer with a plurality of second bonding contacts. The first and second bonding contacts are aligned to bond the first and second bonding contacts and the first via structure and the portion of the second via structure. The second semiconductor structure is thinned to expose the portion of the second via structure and form a semiconductor layer. A third semiconductor structure is bonded to the semiconductor layer. Further, a pad-out interconnect layer is formed on the third semiconductor structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 5A and 5B illustrate a flowchart of an exemplary fabrication process to form a semiconductor device having adjoined via structures formed by bonding, according to some embodiments.

Figure 1A:
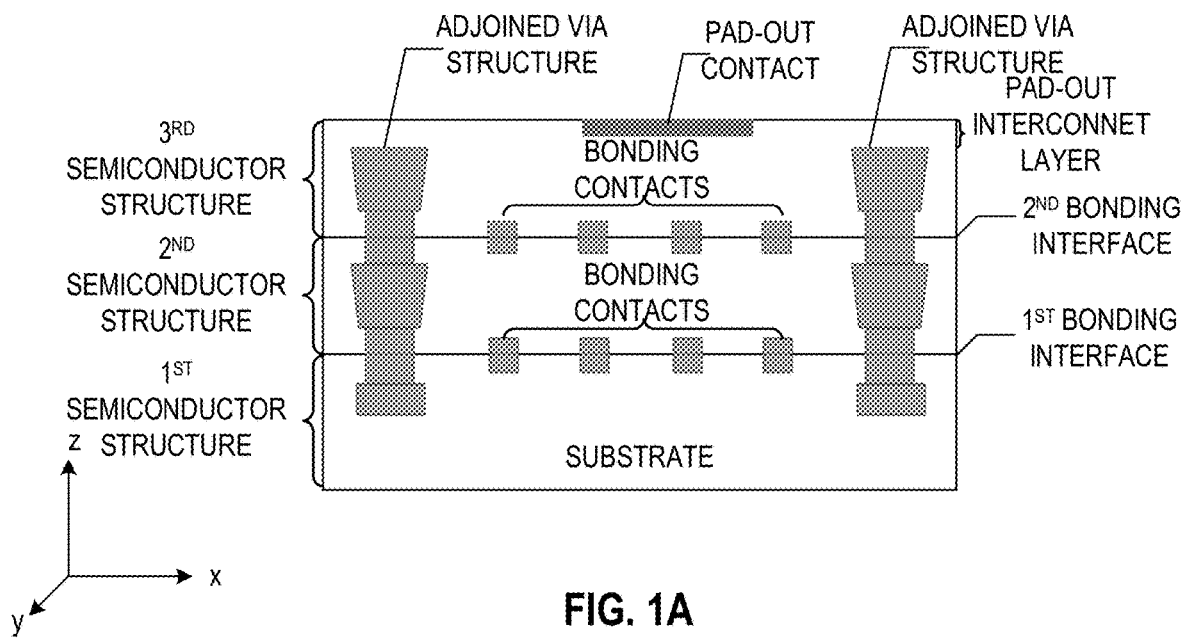
FIG. 1A illustrates a schematic view of a cross-section of an exemplary semiconductor device having adjoined vertical interconnect access (via) structures formed by bonding, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, a "wafer" is a piece of a semiconductor material for semiconductor devices to build in and/or on it and that can undergo various fabrication processes before being separated into dies.

In semiconductor fabrication, wafers are often bonded/stacked vertically to achieve a higher integration level. For example, in the fabrication of three-dimensional (3D) memory devices, wafers carrying memory cells and peripheral circuits are bonded to scale up vertically. In these 3D memory devices, to transmit electrical signals between wafers that are bonded vertically, vias/interconnects such as through-silicon vias (TSVs) are commonly formed to extend through the bonded wafers and form conductive connections with the parts in each bonded wafer.

Different fabrication processes have been used to form these vias/interconnects. In an example, wafers are stacked by bonding formed between dielectrics, and TSVs are formed by etching the wafers, e.g., multiple times, to form openings of desired profiles (e.g., shapes and/or depth). The openings are then filled with a desired conductive material. This approach is a mature technique that simplifies the wiring between wafers, reduces the overall thickness of the bonded wafers, reduces parasitic capacity, and reduces the fabrication cost. In another example, wafers are stacked by bonding between dielectrics and between conductors (e.g., by hybrid bonding), conductive connections are formed through the bonded conductors, and TSVs are formed to conductively connect the bonded conductors for pad-out purposes. Using the second approach, parts in the wafers are formed separately before bonding, and higher alignment precision can be obtained. Meanwhile, thermal budget influence and limitation can be reduced, and undesirable non-uniformities can be reduced. However, no known fabrication methods to form these vias/interconnects have the aforementioned advantages of both approaches.

Various embodiments in accordance with the present disclosure provide semiconductor devices, e.g., 3D memory devices, having adjoined via structures formed by bonding.

In a semiconductor device that includes a plurality of bonded semiconductor structures, adjoined via structures, having same/similar functions as the conventionally-formed TSVs, are formed by vertically bonding respective via portions in each semiconductor structure. Specifically, each adjoined via structure can have a plurality of via portions, each formed in a different semiconductor structure. The via portions can be formed in the same fabrication operations that form the respective bonding contacts and can be bonded in the same bonding process in which the bonding contacts are bonded. In some embodiments, via portions of two semiconductor structures are bonded by aligning and bonding the bonding contacts in the two semiconductor structures. In some embodiments, the lateral dimensions of the bonding contacts are smaller than those of the via portions, and the alignment of bonding contacts can provide sufficient alignment precision for the bonding of the via portions.

Compared to conventional methods that form TSVs, the methods and structure provided by the present disclosure allow the advantages of both conventional approaches mentioned above to be achieved without additional fabrication operations. In other words, the disclosed method can simplify the wiring between semiconductor structures, reduce the overall thickness of the semiconductor structure, reduce parasitic capacity, and reduce the fabrication cost. The disclosed method can also facilitate higher alignment precision, reduce thermal budget influence and limitation, and reduce undesirable non-uniformities.

Figure 1B:
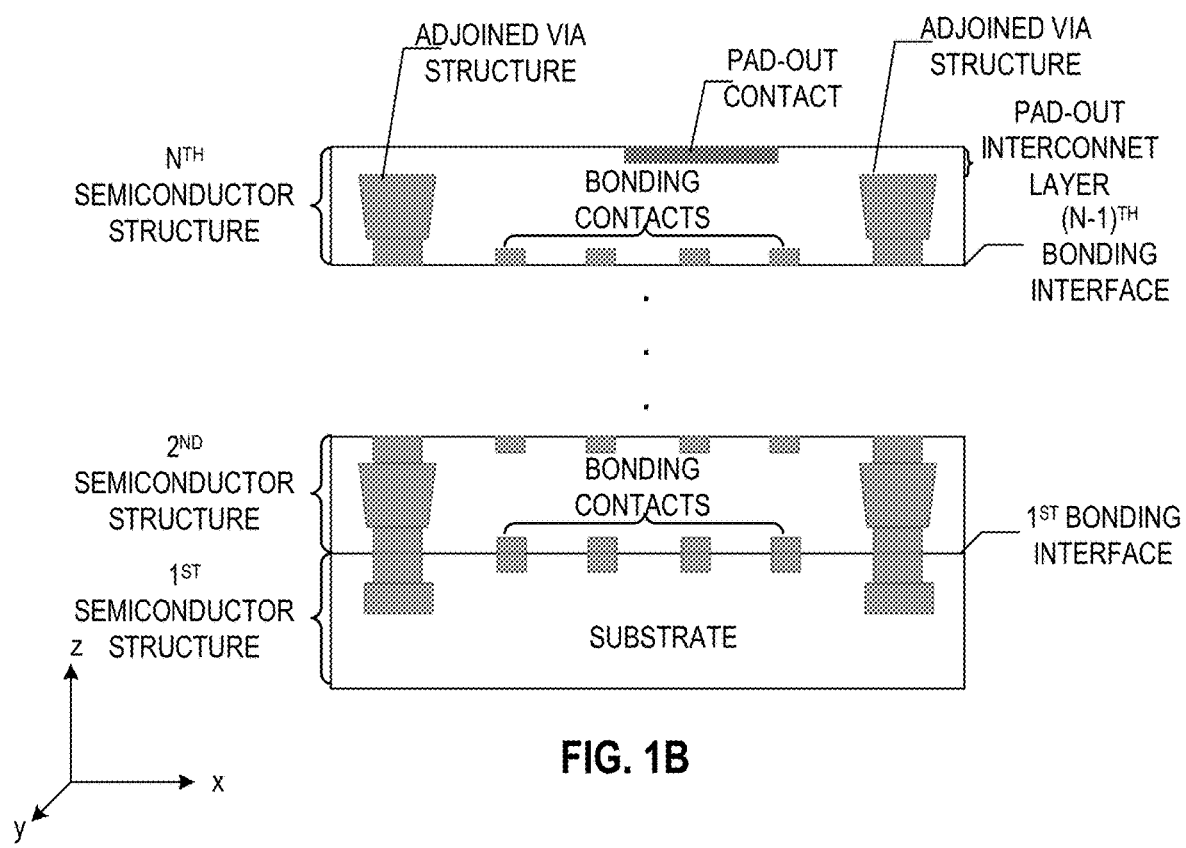
FIG. 1B illustrates a schematic view of a cross-section of another exemplary semiconductor device having adjoined via structures formed by bonding, according to some embodiments.

FIGS. 1A and 1B illustrate schematic cross-sectional views of semiconductor devices 100 and 101 each having adjoined via structures formed by bonding, according to some embodiments. Semiconductor device 100 includes a first, second, and third semiconductor structures bonded vertically (e.g., along the z-axis). Semiconductor device 101 illustrates a general schematic cross-sectional view in which N semiconductor structures are bonded vertically, where N equals to a positive integer greater than 2.

As shown in FIG. 1A, the first semiconductor structure, located at a lower portion of semiconductor device 100, is bonded with the second semiconductor structure at a first bonding interface. The substrate of the first semiconductor structure may function as the substrate of semiconductor device 100. The second semiconductor structure is bonded with the third semiconductor structure at a second bonding interface. The third semiconductor device includes a pad-out interconnect layer at an upper portion of semiconductor device 100. The pad-out interconnect layer includes a pad-put contact that is conductively connected to the parts in semiconductor device 100 for pad-out purposes. At each of the first and second bonding interfaces, semiconductor structures are bonded through respective bonding contacts. In some embodiments, the bonding between the two semiconductor structures at the respective bonding interface includes hybrid bonding.

As shown in FIG. 1A, semiconductor device 100 includes one or more adjoined via structures each extending across at least one bonding interface. In some embodiments, each adjoined via structure extends in all (e.g., three) semiconductor structures to conductively connect the parts in each semiconductor structure. In some embodiments, each adjoined via structure is conductively connected to the pad-out interconnect layer (e.g., the pad-out contact) so that electrical signals can be transmitted between an outside circuit and desired parts of semiconductor device 100. In some embodiments, each adjoined via structure is formed by the bonding of respective via portions in the bonded semiconductor structures. For example, the adjoined via structure can be formed by the bonding of three via portions respectively in the first, second, and third semiconductor structures. At a respective bonding interface, via portions in the bonded semiconductor structures are in contact with and conductively connected to each other. In some embodiments, the sidewall of adjoined via structure has a staggered profile at least one bonding interface. Details of the staggered profile are described below.

In various embodiments, depending on the design and fabrication of semiconductor device 100, each semiconductor structure can include the same or different parts/devices and have the same or different functions. For example, the first and second semiconductor structures may each include a plurality of memory cells, and the third semiconductor structure may include a peripheral circuit of the memory cells. In another example, the first and third semiconductor structures may each include a plurality of memory cells, and the second semiconductor structure may include the peripheral circuit of the memory cells. Other parts, such as logic process-compatible devices, e.g., processors and/or random-access memory (RAM) arrays can also be formed in one or more of the semiconductor structures. The specific functions and structures of each semiconductor structure should not be limited by the embodiments of the present disclosure.

FIG. 1B illustrates semiconductor device 101 similar to semiconductor device 100 except for that N may include any suitable positive integer equal to or greater than 2. For example, N may be 3, 4, 5, . . . . When N is equal to 3, semiconductor device 101 is similar to or the same as semiconductor device 100. The value of N may be determined based on the design and fabrication of semiconductor device 101 and is not limited by the embodiments of the present disclosure. Semiconductor device 101 may include one or more adjoined via structures each extending across at least one bonding interface. In some embodiments, the adjoined via structures each includes N via portions that extend in the N bonded semiconductor structures, e.g., across (N−1) bonding interfaces. In some embodiments, the sidewall of an adjoined via structure has a staggered profile at one or more bonding interfaces, e.g., at all bonding interfaces.

Figure 2A:
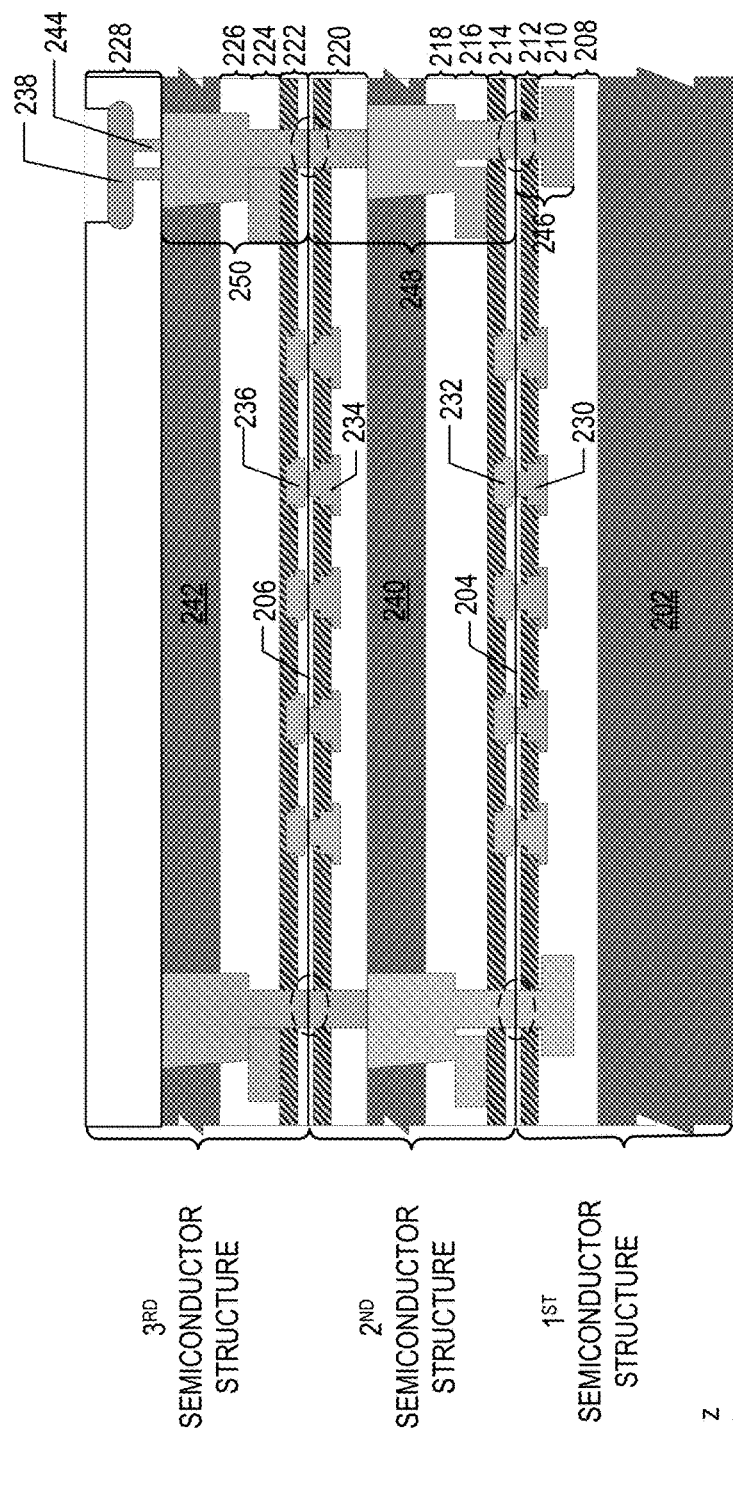
FIG. 2A illustrates a detailed cross-sectional view of an exemplary semiconductor device having adjoined via structures formed by bonding, according to some embodiments.

FIG. 2A illustrates a detailed cross-sectional view of a semiconductor device 200 having adjoined via structures formed by bonding, according to some embodiments. As an example, semiconductor device 200 includes three semiconductor structures bonded vertically. As shown in FIG. 2A, semiconductor device 200 may include a first ($1^{st}$) semiconductor structure bonded with a second ($2^{nd}$) semiconductor structure at a bonding interface 204, in a face-to-face manner Semiconductor device 200 may also include a third ($3^{rd}$) semiconductor structure bonded to the second semiconductor structure at a bonding interface 206, in a face-down manner. In some embodiments, the second semiconductor structure is above the first semiconductor structure, and the third semiconductor structure is above the second semiconductor structure. It is noted that x and y axes are included in figures of the present disclosure to illustrate two orthogonal directions in the plane of a semiconductor structure. The substrate of a semiconductor structure (e.g., the first/second/third semiconductor structure) includes two lateral surfaces extending laterally in the x-y plane: a top surface on the front side of the semiconductor structure/device, and a bottom surface on the backside opposite to the front side. The z-axis is perpendicular to both the x and y axes. As used herein, whether one component (e.g., a layer or a device) is "on," "above," "under," or "below" another component (e.g., a layer or a device) of a semiconductor structure/device is determined relative to the substrate of the semiconductor device in the z-direction (the vertical direction perpendicular to the x-y plane) when the substrate is positioned in the lowest plane of the semiconductor device in the z-direction. The same notion for describing the spatial relationship is applied throughout the present disclosure.

The first semiconductor structure may include a substrate 202, serving as the substrate of semiconductor device 200. Substrate 202 can include silicon (e.g., single crystalline silicon, c-Si), silicon germanium (SiGe), gallium arsenide (GaAs), germanium (Ge), silicon on insulator (SOI), or any other suitable materials. The first semiconductor structure may include a device/memory layer 208 above and in contact with substrate 202. Device/memory layer 208 may include any suitable components, depending on the design of semiconductor device 200. For example, device/memory layer 208 may include a circuit and/or an array of memory cells.

The first semiconductor structure may further include an interconnect layer 210 above and in contact with device/memory layer 208. Interconnect layer 210 may be conductively connected to device/memory layer 208 for transmitting electrical signals from/to device/memory layer 208. Interconnect layer 210 can include a plurality of interconnects. As used herein, the term "interconnects" can broadly include any suitable types of interconnects, such as middle-end-of-line (MEOL) interconnects and back-end-of-line (BEOL) interconnects. In some embodiments, the interconnects in interconnect layer 210 also include local interconnects, such as bit line contacts and word line contacts. Interconnect layer 210 can further include one or more interlayer dielectric (ILD) layers in which the interconnects and via contacts can form. The interconnects and via contacts in interconnect layer 210 can include conductive materials including, but not limited to W, Co, Cu, Al, silicides, or any combination thereof. ILD layers in interconnect layer 210 can include dielectric materials including, but not limited to, silicon oxide, silicon nitride, silicon oxynitride, low-k dielectrics, or any combination thereof.

The first semiconductor structure may further include a bonding layer 212 above and in contact with interconnect layer 210. Bonding layer 212 may include a plurality of bonding contacts 230 distributed in a layer of dielectrics. Bonding contacts 230 may be conductively connected to respective interconnects in interconnect layer 210, if necessary. Bonding contacts 230 can include conductive materials including, but not limited to W, Co, Cu, Al, silicides, or any combination thereof. Dielectrics in bonding layer 212 may include suitable dielectric materials including, but not limited to, silicon oxide, silicon nitride, silicon oxynitride, low-k dielectrics, or any combination thereof.

The first semiconductor structure may further include a first via structure 246 extending from bonding layer 212 into interconnect layer 210. First via structure 246 may extend vertically (e.g., along the z-direction) and be conductively connected to and/or in contact with respective interconnects in interconnect layer 210 to transmit electrical signals. In some embodiments, first via structure 246 is a first via portion of the adjoined via structure. First via structure 246 may include conductive materials including, but not limited to W, Co, Cu, Al, silicides, or any combination thereof. In some embodiments, first via structure 246 and bonding contacts 230 include the same material(s), such as W.

The first semiconductor structure may be bonded with the second semiconductor structure at bonding interface 204. The bonding between the first and second semiconductor structures includes hybrid bonding, also known as "metal/dielectric hybrid bonding", which is a direct bonding technology (e.g., forming bonding between surfaces without using intermediate layers, such as solder or adhesives) and can obtain metal-metal bonding and dielectric-dielectric bonding simultaneously. The second semiconductor structure may include a bonding layer 214 that includes a plurality of bonding contacts 232 distributed in a layer of dielectrics. Bonding layer 214 may be above bonding layer 212, e.g., bonding layers 212 and 214 being on opposite sides of bonding interface 204. At bonding interface 204, each bonding contact 230 is bonded with a respective bonding contact 232. The second semiconductor structure may also include an interconnect layer 216 above and in contact with bonding layer 214, and a device/memory layer 218 above and in contact with interconnect layer 216. The second semiconductor structure may further include a semiconductor layer 240 above and in contact with device/memory layer 218, and a bonding layer 220 above and in contact with semiconductor layer 240.

Second bonding contacts 232 may be conductively connected to respective interconnects in interconnect layer 216, if necessary. In some embodiments, interconnects in interconnect layer 216 may be conductively connected to and/or in contact with device/memory layer 218 for transmitting electrical signals. Semiconductor layer 240 may be formed from a thinned substrate and may include the same material(s) as substrate 202. In some embodiments, bonding layer 214, bonding contacts 232, interconnect layer 216, and device/memory layer 218 may be similar to or the same as bonding layer 212, bonding contacts 230, interconnect layer 210, and device/memory layer 208, and the detailed description of those components is not repeated.

Bonding layer 220 of the second semiconductor structure may include a plurality of bonding contacts 234 distributed in a layer of dielectrics. Each bonding contact 234 may be bonded with a respective bonding contact 236 in the third semiconductor structure at bonding interface 206. The materials of bonding contacts 234 may be similar to or the same as bonding contacts 232 and/or 230, and the materials of dielectrics of bonding layer 220 may be similar to or the same as the dielectrics of bonding layers 212 and/or 214.

The second semiconductor structure may include a second via structure 248 extending through bonding layers 214 and 220 and in the second semiconductor structure. Specifically, second via structure 248 may extend vertically between bonding interfaces 204 and 206 (e.g., through bonding layers 214 and 220, semiconductor layer 240, device/memory layer 218, and interconnect layer 216) to transmit electrical signals. In some embodiments, second via structure 248 is conductively connected to and/or in contact with interconnect layer 216. In some embodiments, second via structure 248 may be a second via portion of the adjoined via structure. In some embodiments, second via structure 248 may be bonded with first via structure 246 at bonding interface 204. In some embodiments, second via structure 248 may be bonded with a third via structure 250 of the third semiconductor structure at bonding interface 206. That is, at bonding interface 204, second via structure 248 is in contact with and conductively connected to first via structure 246; and at bonding interface 206, second via structure 248 is in contact with and conductively connected to third via structure 250. Electrical signals can then be transmitted from the third semiconductor structure to the first and second semiconductor structures, and vice versa. Second via structure 248 may include similar or the same material(s) as first via structure 246. In some embodiments, bonding contacts 232 and 234, and second via structure 248 include the same material(s), such as W.

The third semiconductor structure, bonded with the second semiconductor structure at bonding interface 206, may include a bonding layer 222 having a plurality of bonding contacts 236, an interconnect layer 224 above and in contact with bonding layer 222, a device/memory layer 226 above and in contact with interconnect layer 224, and a semiconductor layer 242 above and in contact with device/memory layer 226. The third semiconductor structure may also include third via structure 250. At bonding interface 206, each bonding contact 236 is bonded with a respective bonding contact 234, and each third via structure 250 is bonded with a respective second via structure 248. In some embodiments, bonding layer 222, interconnect layer 224, device/memory layer 226, and semiconductor layer 242 may respectively be the same as or similar to bonding layer 220/214/212, interconnect layer 210/216, device/memory layer 208/218, and semiconductor layer 240. The detailed description of these components is not repeated. In some embodiments, the bonding between the third and second semiconductor structures includes hybrid bonding.

Third via structure 250 may be the third via portion of the adjoined via structure. As shown in FIG. 2A, third via structure 250 may extend vertically through semiconductor layer 242 and bonding layer 222 and in the third semiconductor structure. Specifically, third via structure 250 may extend from a top surface of semiconductor layer 242 to bonding interface 206, where third via structure 250 is bonded with second via structure 248. That is, third via structure 250 may be in contact with and conductively connected to second via structure 248 at bonding interface 206. In some embodiments, the first, second, and third via structures 246, 248, and 250 form the adjoined via structure that extends in each semiconductor structure of semiconductor device 200, transmitting electrical signals from/to each semiconductor structure. The material(s) of third via structure 250 may be the same as or similar to that of first and/or second via structures 246 and/or 248. In some embodiments, third via structure 250 and bonding contacts 234 include the same material(s). In various embodiments, first, second, and third via structures 246, 248, and 250 include the same material(s).

The shapes and dimensions of each via structure (e.g., 246, 248, and 250) may be determined based on the design and/or fabrication of semiconductor device 200. For example, at each bonding interface, the lateral dimensions (e.g., along the x-axis and/or y-axis) of the respective via structures are greater than the lateral dimensions of the respective bonding contacts. In some embodiments, the lateral dimensions of a portion of a respective via structure extending in a respective bonding layer is less than the lateral dimensions of another portion of the via structure extending in other parts of the respective via structure. For example, as shown in FIG. 2A, each via structure (e.g., 246, 248, or 250) may be laterally narrower at the respective bonding interfaces and wider when it extends into the respective semiconductor structure.

The third semiconductor structure may further include pad-out interconnect layer 228 above and in contact with semiconductor layer 242 for pad-out purposes. Pad-out interconnect layer 228 may include a pad-out contact 238 conductively connected to interconnects 244, which may be conductively connected to third via structure 250 (or the adjoined via structure). Electrical signals can thus be transmitted between an outside circuit and each semiconductor structure of semiconductor device 200, through pad-out contact 238, interconnects 244, and the adjoined via structure. Pad-out contact 238 and interconnects 244 in pad-out interconnect layer 228 may include, but not limited to, W, Co, Cu, Al, silicides, or any combination thereof, and the dielectric structures (e.g., ILD and dielectric layers) in pad-out interconnect layer 228 may include, but not limited to, silicon oxide, silicon nitride, silicon oxynitride, low-k dielectrics, or any combination thereof.

Figure 2B:
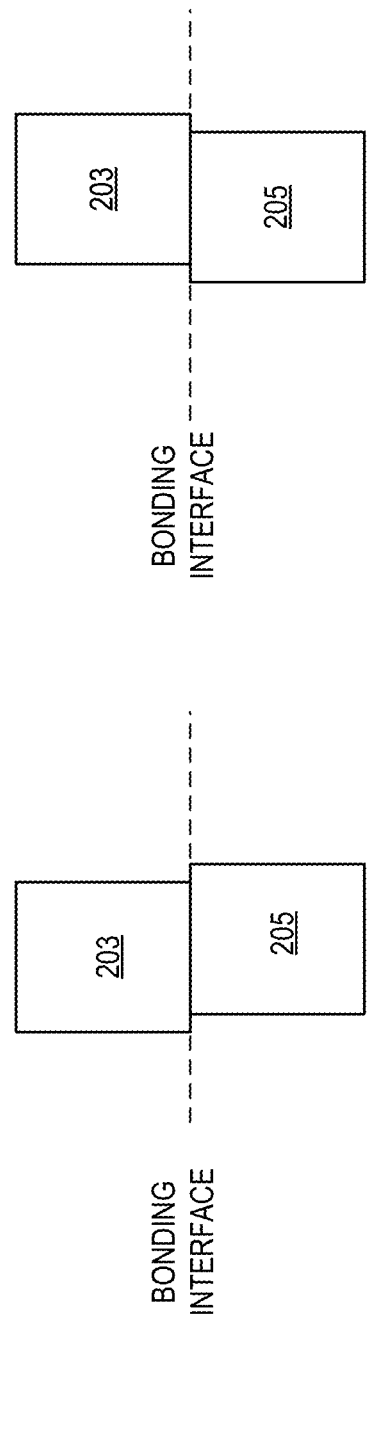
FIG. 2B illustrates a part of an adjoined via structure at a bonding interface, according to some embodiments.

FIG. 2B are detailed illustrations of possible profiles (i) and (ii) of the adjoined via structure at a bonding interface, as marked in dashed circles in FIG. 2A, according to some embodiments. As shown in FIG. 2B, element 203 represents a portion of the adjoined via structure above the bonding interface, and element 205 represents a portion of the adjoined via structure below the bonding interface. For example, the bonding interface may represent bonding interface 204, element 203 may represent a portion of second via structure 248 at/above bonding interface 204, and element 205 may represent a portion of first via structure 246 at/above bonding interface 204. In another example, the bonding interface may represent bonding interface 206, element 203 may represent a portion of third via structure 250 at/above bonding interface 206, and element 205 may represent a portion of second via structure 248 at/above bonding interface 206.

Elements 203 and 205 may or may not have the same lateral dimensions along the x-axis and/or y-axis. The sidewall of the adjoined via structure (or the sidewalls of elements 203 and 205), at the bonding interface, may or may not extend continuously along the z-axis. When elements 203 and 205 have the same lateral dimensions, because elements 203 and 205 are bonded, in some embodiments, elements 203 and 205 may not be fully aligned along the z-axis, e.g., because of alignment deviation/error. That is, the sidewall of the adjoined via structure (or the sidewalls of elements 203 and 205), at the bonding interface, may have a staggered profile or may not extend continuously along the z-axis. For example, element 203 may be shifted along the x-axis (e.g., to the left as profile (i) or to the right (ii)) relative to element 205. That is, in some embodiments, at least two bonded portions of the via structure have a staggered profile, e.g., are not fully aligned with each other, at the respective bonding interface.

In some embodiments, when elements 203 and 205 have the same lateral dimensions and are fully aligned along the z-axis, the sidewall of the adjoined via structure (or the sidewalls of elements 203 and 205) may extend continuously along the z-axis at the bonding interface. That is, in some embodiments, at least two bonded portions of the via structure are fully aligned with each other at the respective bonding interface.

Figure 5B:
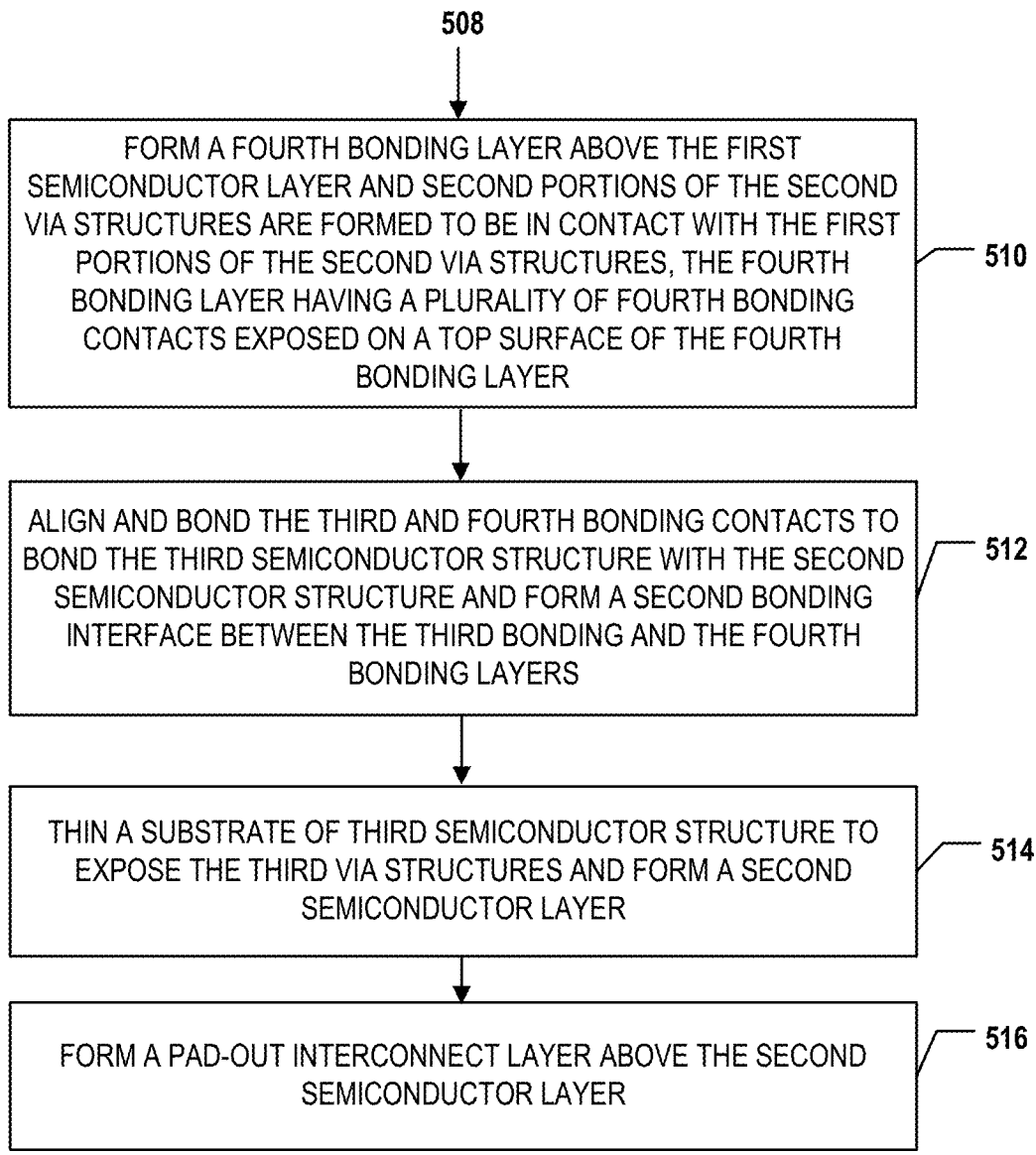

FIGS. 3A-3G illustrate an exemplary method 300 to form a semiconductor device having adjoined via structures formed by bonding, according to some embodiments. FIGS. 5A and 5B illustrate a flowchart 500 of method 300, according to some embodiments. FIG. 5B is a continuation of FIG. 5A. It is understood that the operations shown in method 300 are not exhaustive and that other operations can be performed as well before, after, or between any of the illustrated operations. Further, some of the operations may be performed simultaneously, or in a different order than shown in FIGS. 3 and 5. In some embodiments, method 300 is employed to form semiconductor device 200 in FIG. 2A.

Figure 3A:
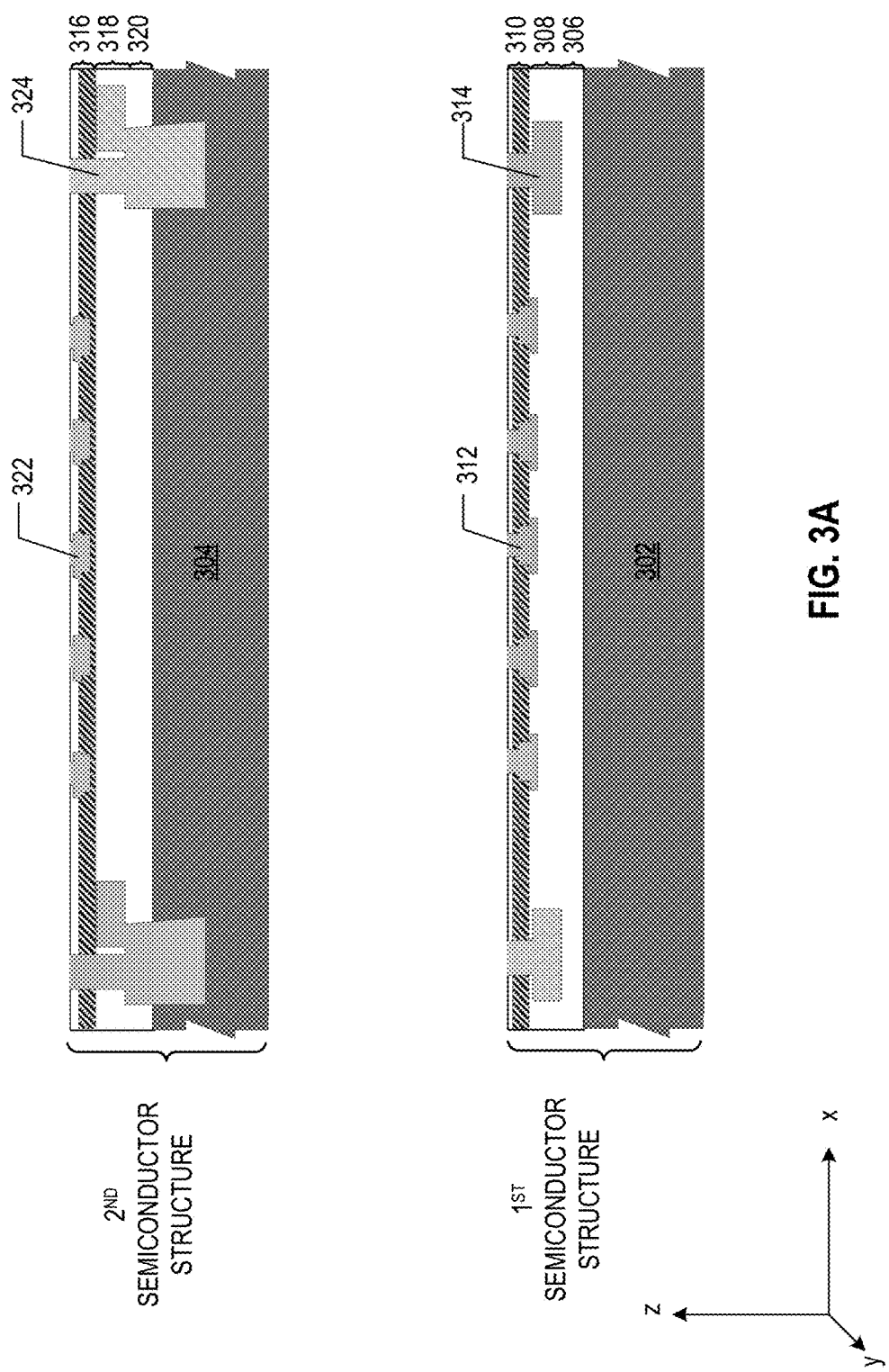
FIGS. 3A-3G illustrate an exemplary fabrication process to form a semiconductor device having adjoined via structures formed by bonding, according to some embodiments.

Referring to FIG. 5A, method 300 starts at operation 502, in which a first semiconductor structure and a second semiconductor structure are formed. The first semiconductor structure has one or more first via structures and a first bonding layer with a plurality of first bonding contacts exposed on a top surface of the first semiconductor structure. The second semiconductor structure has first portions of one or more second via structures and a second bonding layer with a plurality of second bonding contacts exposed on a top surface of the second semiconductor structure. FIG. 3A illustrates the corresponding structures.

As shown in FIG. 3A, the first and second semiconductor structures may be formed. The first semiconductor structure may include a substrate 302, a device/memory layer 306 above substrate 302, a first interconnect layer 308 above and in contact with device/memory layer 306, and a first bonding layer 310 above and in contact with first interconnect layer 308. First bonding layer 310 may include a plurality of first bonding contacts 312 disposed on the top surface of the first semiconductor structure. The first semiconductor structure may also include a first via structure 314, disposed on the top surface of the first semiconductor structure, extending through first bonding layer 310 into first interconnect layer 308. First via structure 314 may be conductively connected to first interconnect layer 308.

Similarly, the second semiconductor structure may include a substrate 304, a device/memory layer 320 above substrate 304, a second interconnect layer 318 above and in contact with device/memory layer 320, and a second bonding layer 316 above and in contact with second interconnect layer 318. Second bonding layer 316 may include a plurality of second bonding contacts 322 disposed on the top surface of the second semiconductor structure. The second semiconductor structure may include a first portion 324-1 of second via structure 324, disposed on the top surface of the second semiconductor structure, extending through second bonding layer 316 into substrate 304. First portion 324-1 of second via structure 324 may be conductively connected to second interconnect layer 318. In some embodiments, the length of first portion 324-1 of second via structure 324 and/or depth of first portion 324-1 of second via structure 324 into substrate 304 are determined based on the portion of substrate 304 to be removed to form a semiconductor layer (e.g., semiconductor layer 240). Optionally, planarization processes, e.g., chemical mechanical planarization (CMP) and/or recess etch, can be performed to remove any excess materials on the top surface of first and second bonding layers 310 and 316.

The first and second semiconductor structures may be formed by similar methods/processes and can be formed separately or individually. In some embodiments, a memory stack (not shown) is formed above the respective substrate (e.g., 302 and/or 304), in the respective device/memory layer (e.g., 306 and/or 320). An array of 3D NAND memory strings may be formed extending vertically through the memory stack to form a 3D memory device (e.g., similar to a 3D memory device 400 in FIG. 4, described in detail below). To form the memory stack, interleaved sacrificial layers (not shown) and dielectric layers (not shown) are formed above the substrate (e.g., 302 and/or 304). The interleaved sacrificial layers and dielectric layers can form a dielectric stack (not shown). In some embodiments, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layered deposition (ALD), or any combination thereof. In some embodiments, a memory stack can be formed by a gate replacement process, e.g., replacing the sacrificial layers with a plurality of conductor layers using wet/dry etch of the sacrificial layers selective to the dielectric layers and filling the resulting recesses with the conductor layers. As a result, the memory stack can include interleaved conductor layers (not shown) and dielectric layers. In some embodiments, each conductor layer includes a metal layer, such as a layer of tungsten. It is understood that the memory stack may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between the memory stack and the substrate.

A plurality of 3D NAND memory strings may be formed above the substrate, each extending vertically through interleaved conductor layers and dielectric layers of the memory stack. In some embodiments, fabrication processes to form 3D NAND memory strings include forming a channel hole through the memory stack and into the substrate using dry etching/and or wet etching, such as deep reactive-ion etching (DRIE), followed by epitaxially growing a plug in the lower portion of the channel hole from the substrate. In some embodiments, the fabrication processes to form the 3D NAND memory strings also include subsequently filling the channel holes each with a plurality of layers, such as a memory film (e.g., a tunneling layer, a storage layer, and a blocking layer) and a semiconductor layer, using thin film deposition processes such as ALD, CVD, PVD, or any combination thereof. In some embodiments, the fabrication processes to form the 3D NAND memory strings further include forming another plug in the upper portion of each channel hole by etching a recess at the upper ends of the 3D NAND memory strings, followed by filling the recess with a semiconductor material using thin film deposition processes such as ALD, CVD, PVD, or any combination thereof.

An interconnect layer (e.g., 308 or 318) may be formed above the device/memory layer (e.g., 306 or 320). The interconnect layer can include interconnects of MEOL and/or BEOL in a plurality of ILD layers to make electrical connections with the array of 3D NAND memory strings. In some embodiments, the interconnect layer includes multiple ILD layers and interconnects therein formed in multiple processes. For example, the interconnects in the interconnect layer can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof.

A bonding layer (e.g., 310 or 316) may be formed above the interconnect layer. The bonding layer can include a plurality of bonding contacts (e.g., 312 or 322) surrounded by dielectrics. In some embodiments, a dielectric layer is deposited on the top surface of the interconnect layer (e.g., 308 or 318) by one or more thin film deposition processes including, but not limited to, CVD, PVD, ALD, or any combination thereof. The bonding contacts then can be formed through the dielectric layer and in contact with the interconnects in the interconnect layer by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor. In some embodiments, the via structures (e.g., 314 or 324) can be formed by the same patterning and deposition processes that form the respective bonding contacts.

Figure 3B:
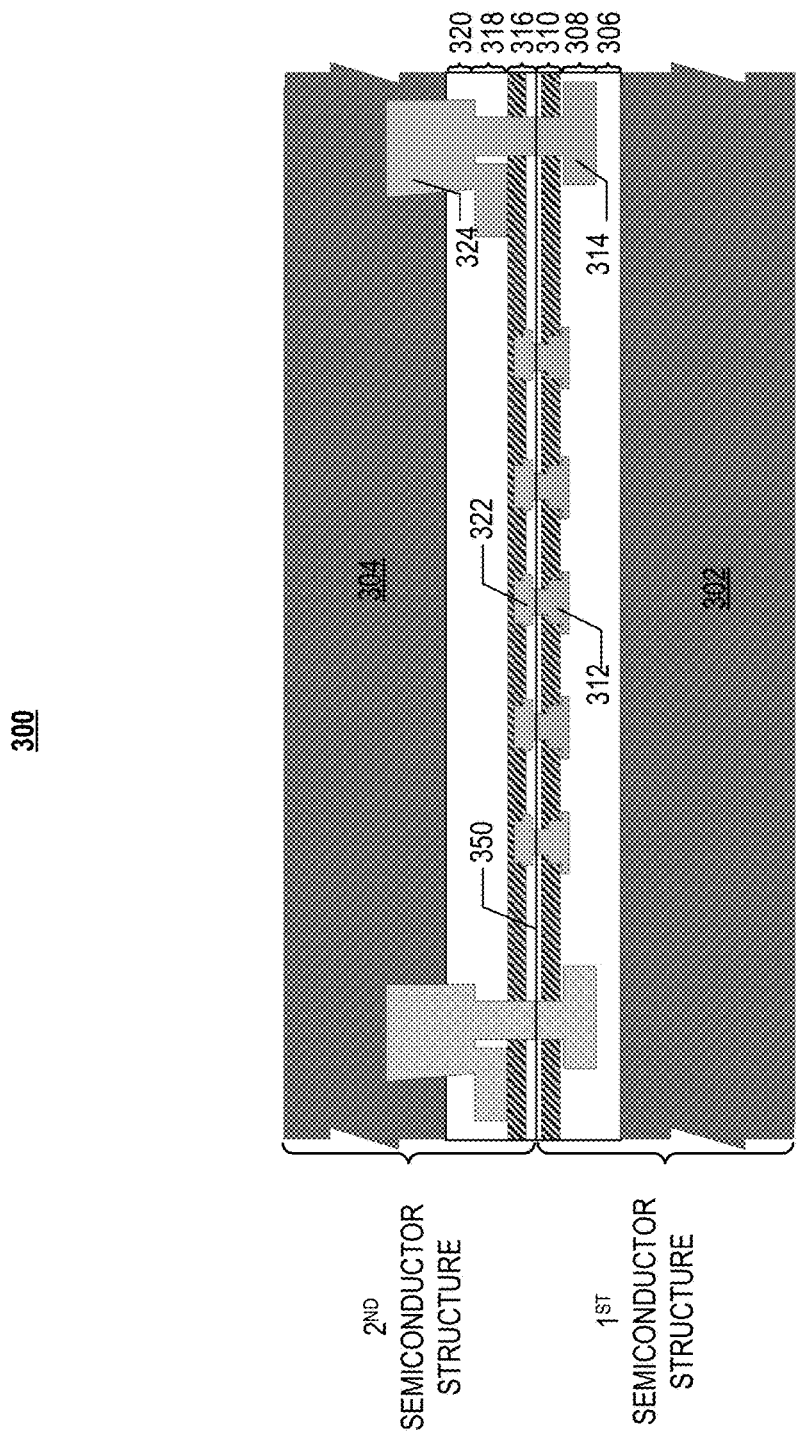

Referring back to FIG. 5A, after the first and second semiconductor structures are formed, method 300 proceeds to operation 504, in which the first and second bonding contacts are aligned and bonded to bond the first and second semiconductor structures in a face-to-face manner and form a first bonding interface between the first and second bonding layers. FIG. 3B illustrates a corresponding structure.

As shown in FIG. 3B, first bonding contacts 312 and second bonding contacts 322 are aligned and bonded with each other. The dielectrics of the bonding layers may accordingly be bonded together. In some embodiments, the bonding between the first and second semiconductor structures includes hybrid bonding. First bonding interface 350 may be formed between first and second bonding layers 310 and 316 (e.g., between the first and second semiconductor structures). Accordingly, first via structure 314 and first portion 324-1 of second via structures 324 may be bonded at first bonding interface 350. In some embodiments, because the lateral dimensions of the via structures (e.g., 314 and 324) are greater than the lateral dimensions of the bonding contacts (e.g., 312 and 322), the alignment and bonding of the bonding contacts can allow sufficiently large area of the via structures (e.g., 314 and 324) to overlap and be bonded at first bonding interface 350.

Figure 3C:
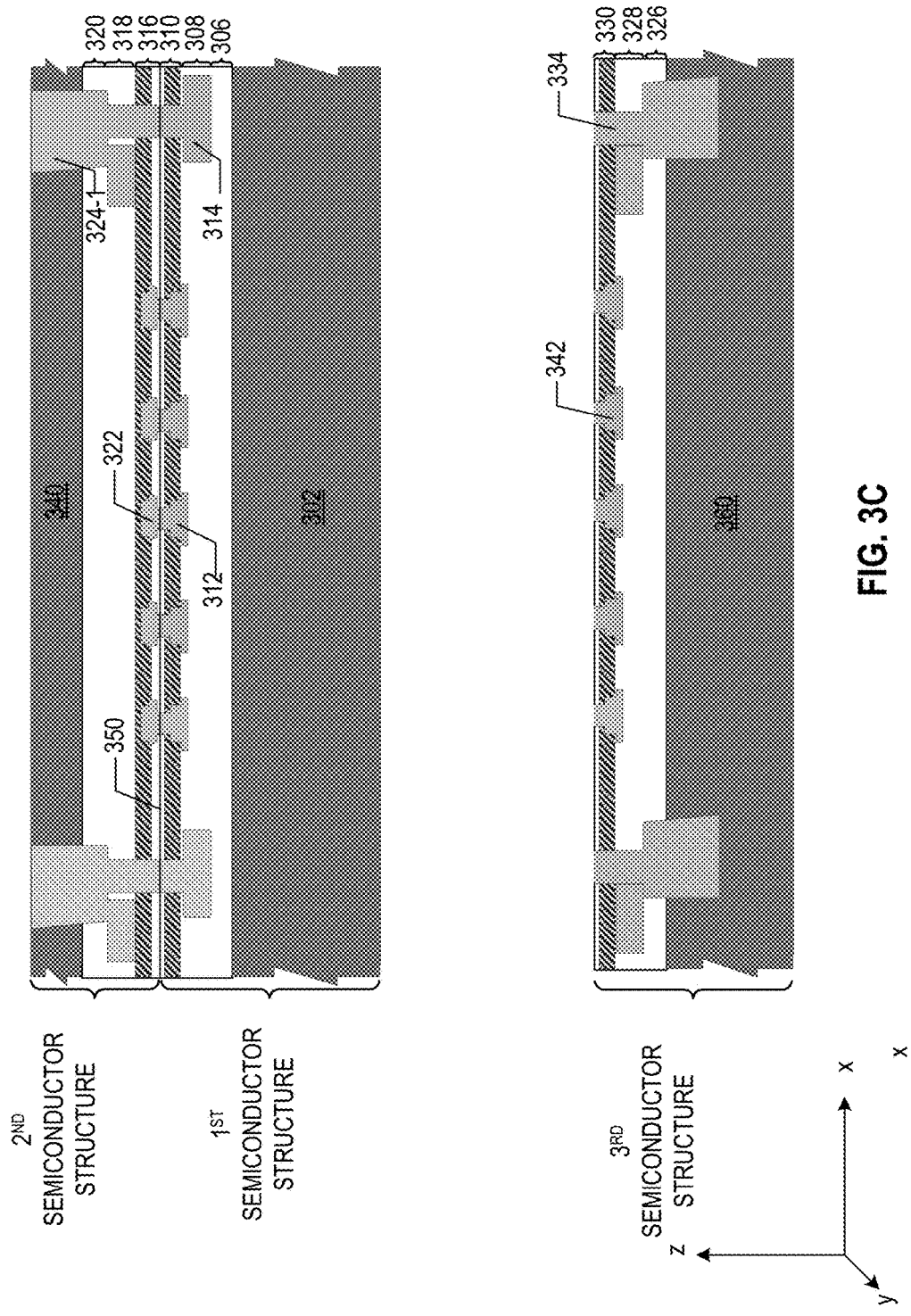

Referring back to FIG. 5A, after the bonding contacts are aligned and bonded, method 300 proceeds to operation 506, in which the substrate of the second semiconductor structure is thinned to expose the first portion of second via structure and form a first semiconductor layer. FIG. 3C illustrates a corresponding structure.

As shown in FIG. 3C, substrate 304 at the top of the bonded semiconductor structures is thinned, so that the thinned top substrate 304 can serve as a first semiconductor layer 340, for example, a single-crystal silicon layer or a polysilicon layer. The thickness of first semiconductor layer 340 can be between about 200 nm and about 100 µm, such as between 200 nm and 100 µm, or between about 150 nm and about 50 µm, such as between 150 nm and 50 µm. Substrate 304 can be thinned by processes including, but not limited to, wafer grinding, dry etch, wet etch, CMP, any other suitable processes, or any combination thereof. Second via structure 324 may or may not be exposed after substrate 304 is thinned. In some embodiments, first portion 324-1 of second via structure 324 is exposed on the top surface of first semiconductor layer 340. In some embodiments, first semiconductor layer 340 covers first portion 324-1 of second via structure 324, and the distance between the top surface of first semiconductor layer 340 and the top surface of first portion 324-1 of second via structure 324 is in a range of about 1 µm to about 20 µm, such as between 1 µm and 10 µm, e.g., 1 µm, 5 µm, 10 µm, etc.

Referring back to FIG. 5A, after the first semiconductor layer is formed, method 300 proceeds to operation 508, in which a third semiconductor structure is formed. The third semiconductor structure includes one or more third via structures and a third bonding layer having a plurality of third bonding contacts exposed on a top surface of the third semiconductor structure. FIG. 3C illustrates the corresponding structure.

As shown in FIG. 3C, the third semiconductor structure is formed. The third semiconductor structure may include a substrate 360, a device/memory layer 326 above and in contact with substrate 360, a third interconnect layer 328 above and in contact with device/memory layer 326, and a third bonding layer 330 above and in contact with third interconnect layer 328. Third bonding layer 330 may include a plurality of third bonding contacts 342 disposed on the top surface of the third semiconductor structure. The third semiconductor structure may also include a third via structure 334 extending from the top surface of the third semiconductor structure into substrate 360. In some embodiments, the length of third via structure 334 and/or depth of third via structure 334 into substrate 360 are determined based on the portion of substrate 360 to be removed to form a semiconductor layer (e.g., semiconductor layer 242). Optionally, a planarization process, e.g., CMP and/or recess etch, can be performed to remove any excess materials on the top surface of third bonding layer 330. The fabrication process of third interconnect layer 328 and third bonding layer 330 of third semiconductor structure may be similar to or the same as the fabrication process of second interconnect layer 318 and second bonding layer 316 of second semiconductor structure, and the detailed description is not repeated herein.

In some embodiments, device/memory layer 326 includes a peripheral circuit (and any other logic process-compatible devices) of the memory cells of at least one of the first and second semiconductor structures. To form the third semiconductor structure, device/memory layer 326 having the peripheral circuit is formed on substrate 360, third interconnect layer 328 is formed above and conductively connected to device/memory layer 326, and third bonding layer 330 is formed above and in contact with third interconnect layer 328. In some embodiments, to form the peripheral circuits (and any other logic process-compatible devices), a plurality of transistors are formed on substrate 360.

In some embodiments, the plurality of transistors are formed on substrate 360. The transistors can be formed by a plurality of processes including, but not limited to, photolithography, dry/wet etch, thin film deposition, thermal growth, implantation, CMP, and any other suitable processes. In some embodiments, doped regions are formed in substrate 360 by ion implantation and/or thermal diffusion, which function, for example, as source regions and/or drain regions of the transistors. In some embodiments, isolation regions (e.g., STIs) are also formed in substrate 360 by wet/dry etch and thin film deposition. The transistors can form device/memory layer 326 on substrate 360. In some embodiments, other logic process-compatible devices in device/memory layer 326 are formed by similar fabrication processes.

Further, third interconnect layer 328 can be formed above device/memory layer 326. Third interconnect layer 328 can include interconnects of MEOL and/or BEOL in a plurality of the formation of third interconnect layer 328 may be the same as or similar to the formation of first and second interconnect layers 308 and 318, and the detailed description is not repeated herein. The ILD layers and interconnects can be collectively referred to as third interconnect layer 328. Third bonding layer 330 may be formed above third interconnect layer 328. Third bonding layer 330 can include a plurality of third bonding contacts 342 surrounded by dielectrics. The formation of third bonding layer 330 may be the same as or similar to the formation of first and second bonding layers 310 and 316, and the detailed description is not repeated herein.

It should be noted that operation 508 may be performed before, after, or in parallel with any one of operations 502-506. That is, the third semiconductor structure can be formed at any suitable time before it is bonded with the second semiconductor structure. In some embodiments, the third semiconductor structure is formed in a separate process that forms the first and second semiconductor structures. The specific order to form the first, second, and third semiconductor structures should not be limited by the embodiments of the present disclosure.

Figure 3D:
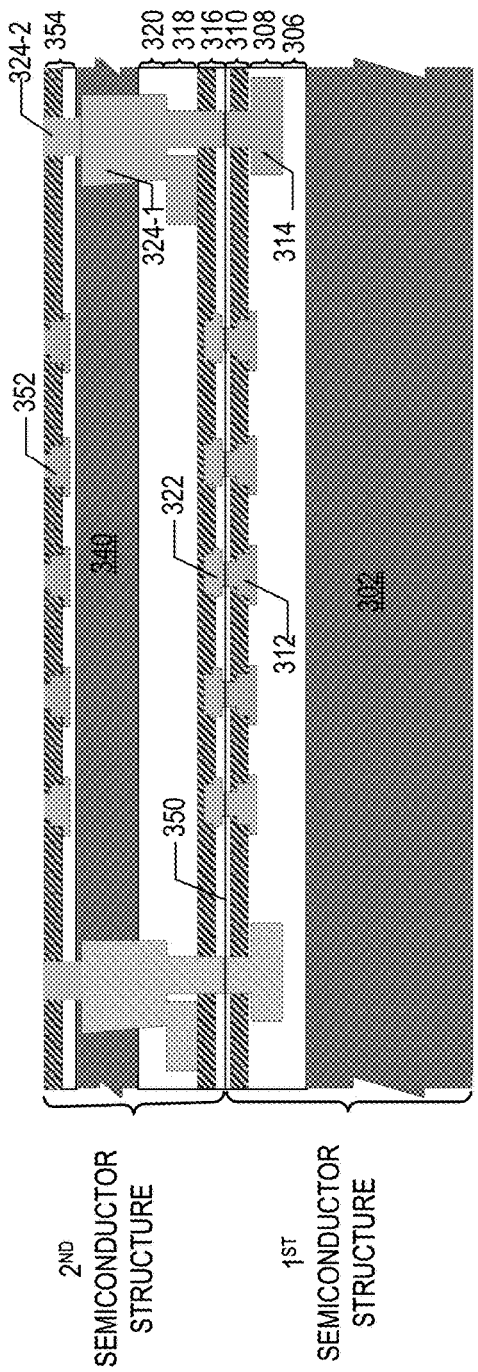
Figure 3D:
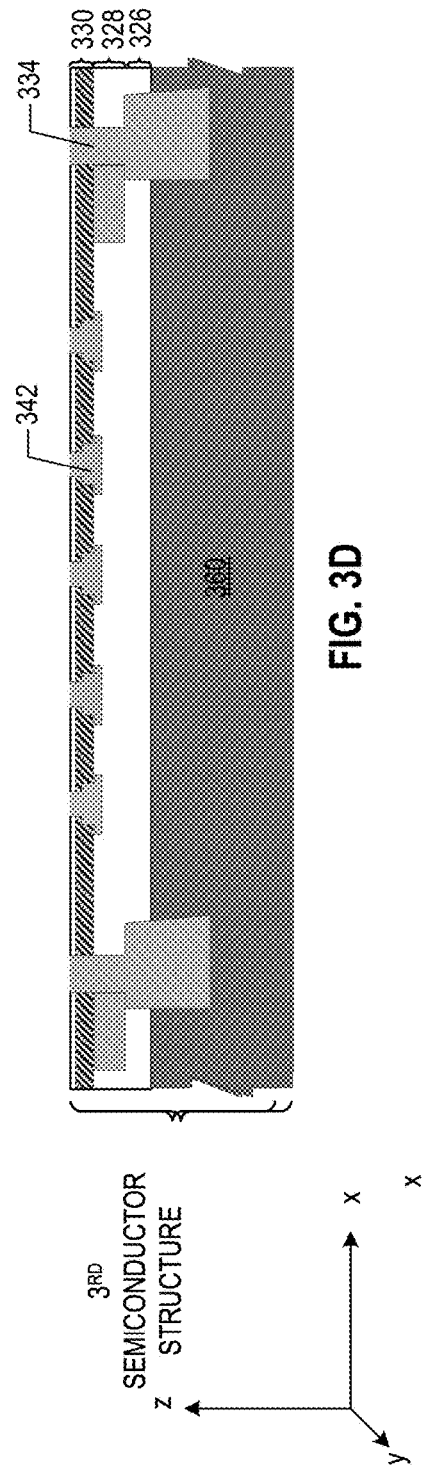

Referring back to FIG. 5B, after the third semiconductor structure is formed, method 300 proceeds to operation 510, in which a fourth bonding layer is formed above the first semiconductor layer and second portions of the second via structures are formed to be in contact with first portions of the second via structures. The fourth bonding layer has a plurality of fourth bonding contacts exposed on a top surface of the fourth bonding layer. FIG. 3D illustrates a corresponding structure.

As shown in FIG. 3D, a fourth bonding layer 354 is formed above and in contact with first semiconductor layer 340, and a second portion 324-2 of each second via structure 324 is formed extending in the second semiconductor structure to be in contact with and conductively connected to the respective first portion 324-1 of second via structure 324. Fourth bonding layer 354 may include a plurality of fourth bonding contacts 352 disposed on the top surface of fourth bonding layer 354. In some embodiments, fourth bonding layer 354 may be formed by the same or similar fabrication processes that form first, second, and third bonding layers 310, 316, and 330, and the detailed description is not repeated herein. In some embodiments, second portion 324-2 of second via structure 324 is formed by the same processes that form fourth bonding contacts 352. For example, after the dielectrics of fourth bonding layer 354 is formed, the dielectrics may be patterned, e.g., using dry and/or wet etching processes, to form a plurality of contact holes and one or more via openings that each exposes a corresponding first portion 324-1 of second via structure 324. The same deposition process can be performed to deposit a conductive material, such as W, Al, Cu, Co, silicides, or any combination thereof, to fill the contact holes and via openings. Fourth bonding contacts 352 and second portions 324-2 of second via structure 324 may be formed. Each first portion 324-1 and the respective second portion 324-2 of second via structure 324 may form a second via structure 324. Optionally, a planarization process, e.g., CMP and/or recess etch, can be performed to remove any excess materials on the top surface of fourth bonding layer 354.

It should be noted that operations 508 may be performed before, after, or in parallel with operation 510. That is, the third and fourth bonding layers may be formed at any suitable time before they are bonded at second bonding interface 356. The specific order to perform operations 508 and 510 should not be limited to the embodiments of the present disclosure.

Figure 3E:
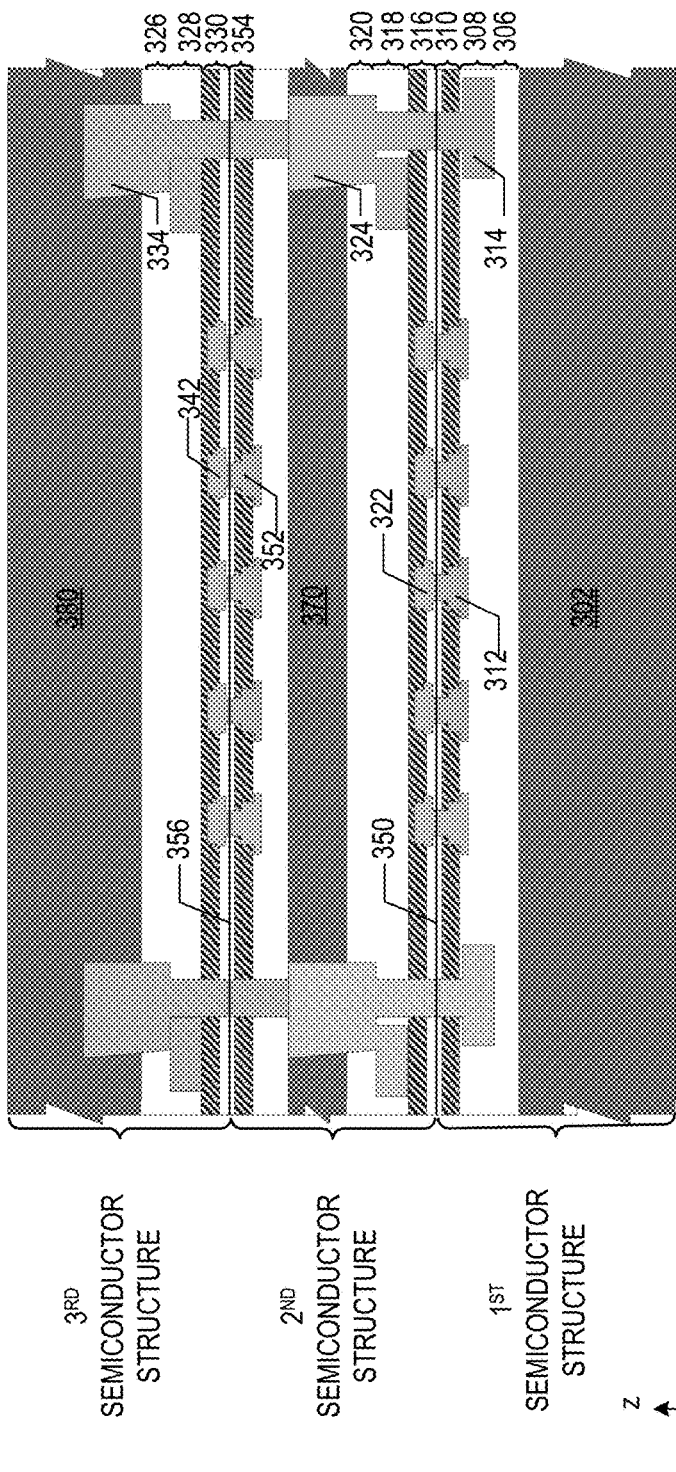

Referring back to FIG. 5B, after the fourth bonding layer is formed, method 300 proceeds to operation 512, in which the third and fourth bonding contacts are aligned and bonded to bond the third and second semiconductor structures and form a second bonding interface between the third and fourth bonding layers. FIG. 3E illustrates a corresponding structure.

As shown in FIG. 3E, the third semiconductor structure may be flipped up-side-down such that third bonding contacts 342 may be aligned and bonded to corresponding fourth bonding contacts 352. A second bonding interface 356 may be formed between third and fourth bonding layers 330 and 354 (e.g., between the third and second semiconductor structures). Accordingly, third via structures 334 are bonded with respective second via structures 324. Adjoined via structures may be formed from the bonding of the first, second, and third via structures 314, 314, and 334. In some embodiments, the bonding between the third and second semiconductor structures includes hybrid bonding. The bonding process may be similar to that of the first and second semiconductor structures, and the detailed description is not repeated herein.

Figure 3F:
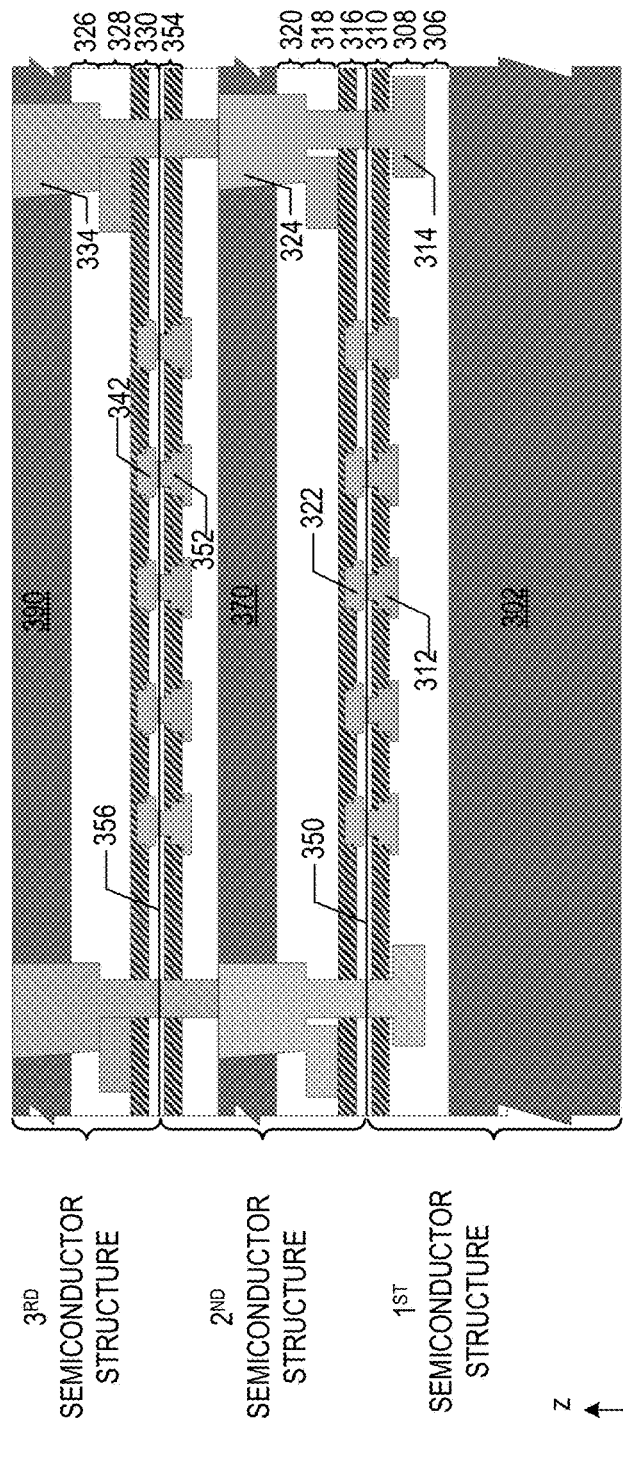

Referring back to FIG. 5B, after the third semiconductor structure is bonded to the second semiconductor structure, method 300 proceeds to operation 514, in which a substrate of the third semiconductor structure is thinned to expose the third via structure and form a second semiconductor layer. FIG. 3F illustrates a corresponding structure.

As shown in FIG. 3F, substrate 380 of the third semiconductor structure is thinned to a desired thickness and form a second semiconductor layer 390. In some embodiments, third via structures 334 are exposed on the top surface of second semiconductor layer 390. In some embodiments, second semiconductor layer 390 covers third via structure 334.

Figure 3G:
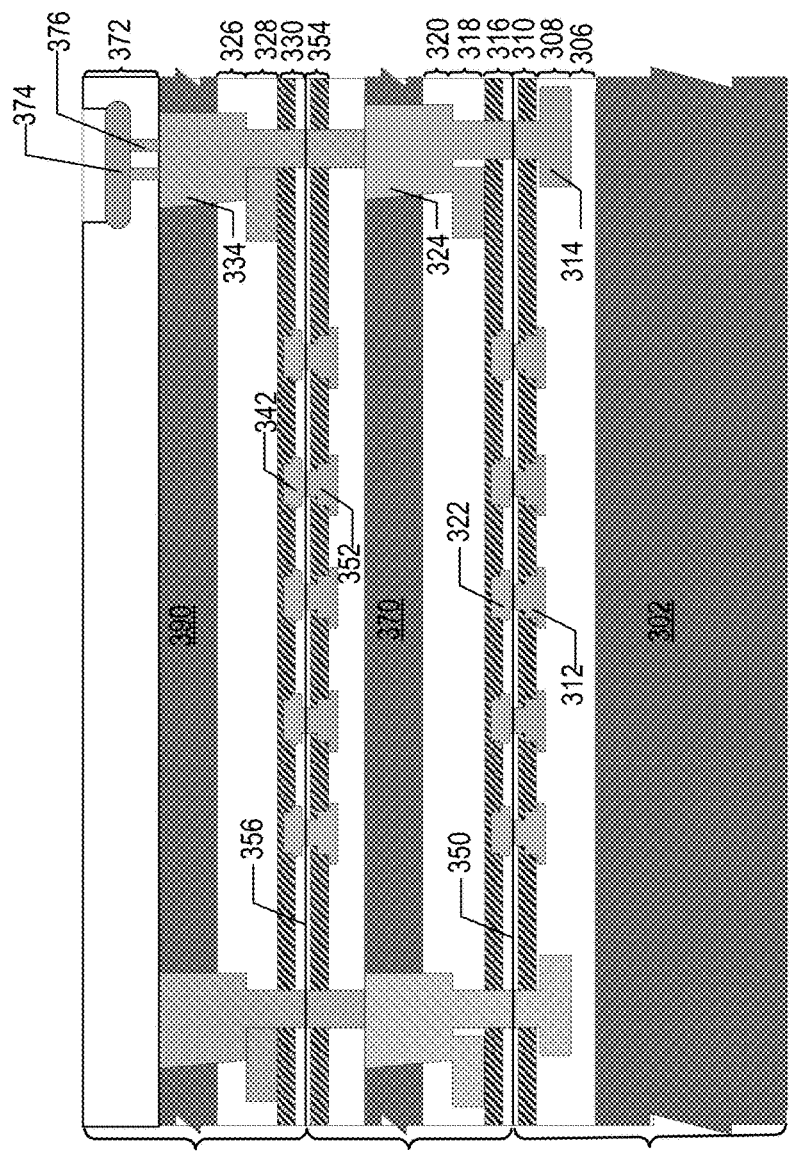

Referring back to FIG. 5B, after the second semiconductor layer is formed, method 300 proceeds to operation 516, in which a pad-out interconnect layer is formed above the second semiconductor layer. FIG. 3G illustrates a corresponding structure.

As shown in FIG. 3G, a pad-out interconnect layer 372, having a pad-out contact 374 and interconnects 376, are formed above and in contact with second semiconductor layer 390. Interconnects 376 may be conductively connected to pad-out contact 374 and third via structure 334 (or the adjoined via structure). Pad-out interconnect layer 372 can include interconnects, such as pad-out contact 374, formed in one or more ILD layers. Interconnects 376 can be in contact with the adjoined via structure and pad-out contact 374. Pad-out contact 374 can be formed by depositing a conductive material such as W over second semiconductor layer 390 to conductively connect the adjoined via with an outside circuit.

Figure 4:
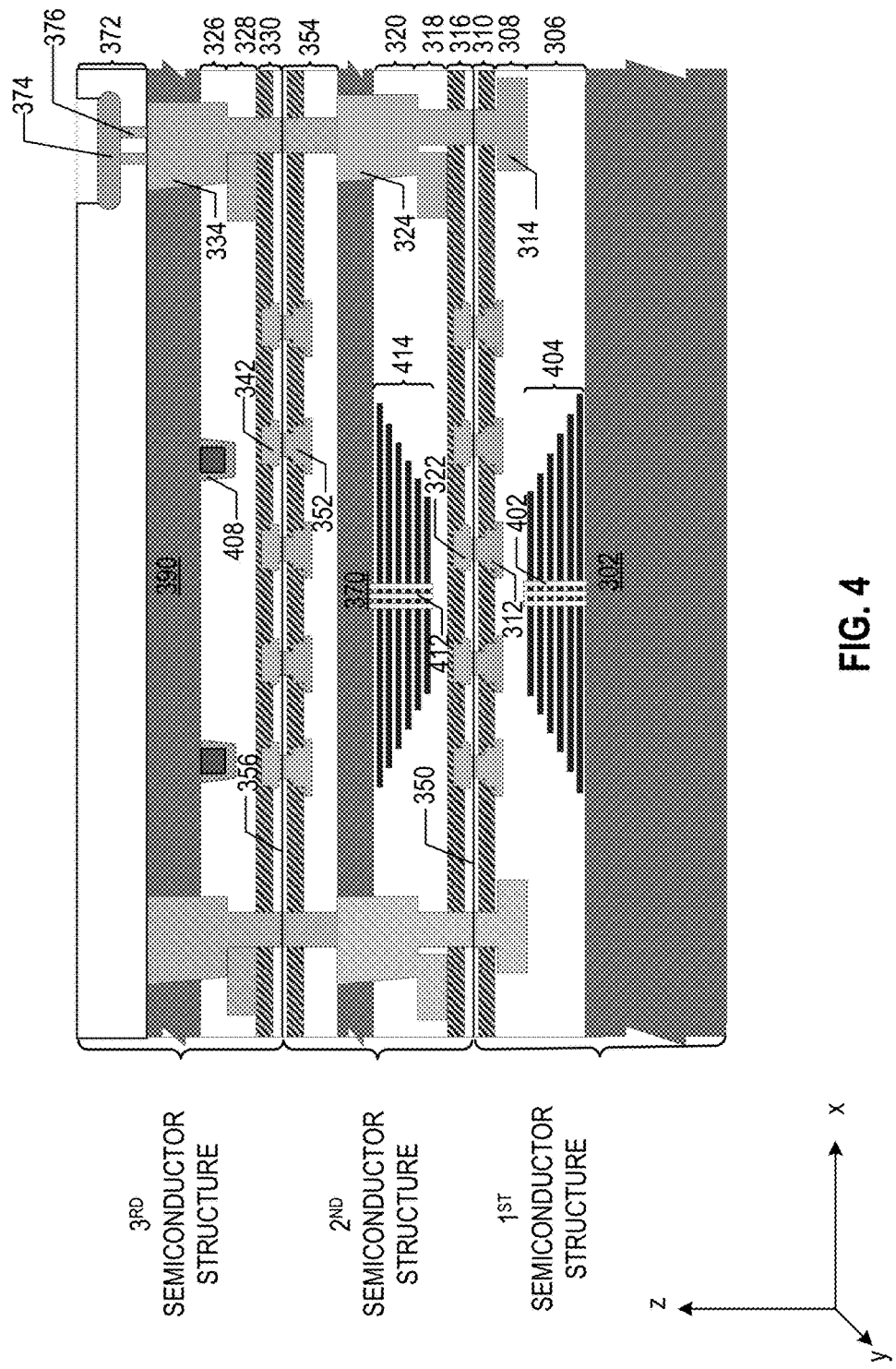
FIG. 4 illustrates an exemplary 3D memory device having adjoined via structures formed by bonding, according to some embodiments.

FIG. 4 illustrates a cross-sectional view of another semiconductor device having adjoined via structures formed by bonding, according to some embodiments. The semiconductor device may be a 3D memory device 400 that includes at least one memory array. As shown in FIG. 4, similar to semiconductor device 200, 3D memory device 400 may include a first and a second semiconductor structures bonded at a bonding interface 350, and a third and a second semiconductor structures bonded at a bonding interface 356. In some embodiments, 3D memory device 400 can be formed using method 300.

In 3D memory device 400, at least one of the first and second semiconductor structures includes a memory array, and the third semiconductor structure includes a peripheral circuit of the memory array. In some embodiments, each of first and second semiconductor structures includes a memory array, and the third semiconductor structure includes the peripheral circuit of both memory arrays. As shown in FIG. 4, the first semiconductor structure may include a memory layer e.g., device/memory layer 306, between and in contact with substrate 302 and interconnect layer 308. Device/memory layer 306 may include a memory stack 404 and a plurality of 3D NAND memory strings 402 extending in memory stack 404 and in contact with substrate 302. The second semiconductor structure may include a memory layer, e.g., device/memory layer 320, between and in contact with semiconductor layer 370 and interconnect layer 318. Device/memory layer 320 may include a memory stack 414 and a plurality of 3D NAND memory strings 412 extending in memory stack 414 and in contact with semiconductor layer 370. The third semiconductor structure may include a device layer 326 in contact with and between semiconductor layer 390 and interconnect layer 328. The device layer 326 may include the peripheral circuit of memory cells formed by 3D NAND memory strings 402 and 412. In some embodiments, the peripheral circuit is conductively connected to the adjoined via structures and includes a plurality of transistors 408.

In some embodiments, each 3D NAND memory string 402/412 extends vertically through the respective memory stack (e.g., 404 and 414), which includes a plurality of pairs each including a conductor layer and a dielectric layer, according to some embodiments. The interleaved conductor layers and dielectric layers in the memory stack alternate in the vertical direction, according to some embodiments. In other words, except for the ones at the top or bottom of the memory stack, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string (e.g., 402 and 412) is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string can have a cylinder shape (e.g., a pillar shape). The semiconductor channel, the tunneling layer, the storage layer, and the blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, the 3D NAND memory strings (e.g., 402 and 412) further include a plurality of control gates. Each conductor layer in the respective memory stack can act as a control gate for each memory cell of the respective 3D NAND memory strings. In some embodiments, each 3D NAND memory string includes two plugs at a respective end in the vertical direction. As used herein, the "upper end" of a component that is facing up (e.g., 3D NAND memory string 402) is the end farther away from substrate 302 in the z-axis, and the "upper end" of a component that is facing down (e.g., 3D NAND memory string 412) is the end far away from the respective semiconductor layer (e.g., semiconductor layer 370) in the z-axis. As used herein, the "lower end" of the component that is facing up (e.g., 3D NAND memory string 402) is the end closer to substrate 302 in the z-axis, and the "lower end" of the component that is facing down (e.g., 3D NAND memory string 412) is the end closer to the respective semiconductor layer (e.g., semiconductor layer 370) in the z-axis. The plug at the lower end of the 3D NAND memory string and in contact with the semiconductor channel can include a semiconductor material, such as single-crystal silicon, that is epitaxially grown from substrate 302/semiconductor layer 390. This plug can function as the channel controlled by a source select gate of the 3D NAND memory string. The other plug at the upper end and in contact with the semiconductor channel can include semiconductor materials (e.g., polysilicon). By covering the upper end of the 3D NAND memory string during the fabrication of the first semiconductor structure, the plug at the other end can function as an etch stop layer to prevent etching of dielectrics filled in the 3D NAND memory string, such as silicon oxide and silicon nitride. In some embodiments, the plug at the upper end functions as the drain of the 3D NAND memory string.

It is understood that 3D NAND memory strings 402 and 412 are not limited to the "charge trap" type of 3D NAND memory strings and may be "floating gate" type of 3D NAND memory strings in other embodiments. Substrate 302 and semiconductor layer 390 may include polysilicon as the source plate of the "floating gate" type of the 3D NAND memory strings. In some embodiments, memory stacks 404 and 414 include a plurality of 2D NAND memory strings.

The third semiconductor structure may include the peripheral circuits (and any other suitable logic process-compatible devices) for memory cells formed by 3D NAND memory strings 402 and 412. Device layer 326 may include a plurality of transistors 408 formed "on" semiconductor layer 390, in which the entirety or part of transistors 408 are formed under semiconductor layer 390 (e.g., above the bottom surface of semiconductor layer 390) and/or directly under semiconductor layer 390. Isolation regions (e.g., shallow trench isolations (STIs)) and doped regions (e.g., source regions and drain regions of transistors 408) can be formed in semiconductor layer 390 as well. The isolation regions may include any suitable dielectric materials such as silicon oxide, silicon nitride, and/or silicon oxynitride. Transistors 408 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

Transistors 408 may form or be part of various devices in device layer 326. In some embodiments, device layer 326 includes peripheral circuits formed entirely or partially by transistors 408. The peripheral circuits may be part or the entirety of the peripheral circuit. In some embodiments, transistors 408 form peripheral circuit, i.e., any suitable digital, analog, and/or mixed-signal control and sensing circuits used for facilitating the operation of the NAND memory including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

According to embodiments of the present disclosure, a semiconductor device includes a first semiconductor structure and a second semiconductor structure. The first semiconductor structure includes a first bonding layer having a plurality of first bonding contacts, and a first via structure extending vertically through the first bonding layer and into the first semiconductor structure. The second semiconductor structure includes a second bonding layer having a plurality of second bonding contacts, and a second via structure extending vertically through the second bonding layer and into the second semiconductor structure. The semiconductor device also includes a bonding interface between the first bonding layer and the second bonding layer. The first bonding contacts are in contact with the second bonding contacts at the bonding interface, the first via structure is in contact with the second via structure, and sidewalls of the first via structure and the second via structures have a staggered profile at the bonding interface.

In some embodiments, the first and second bonding layers are on opposite sides of the bonding interface.

In some embodiments, the first semiconductor structure includes a substrate, a first interconnect layer above the substrate, and the first bonding layer at the bonding interface and above the first interconnect layer. In some embodiments, the second semiconductor structure includes the second bonding layer at the bonding interface and under a second interconnect layer, the second interconnect layer, and a first semiconductor layer above the second interconnect layer.

In some embodiments, the first via structure is conductively connected to the first interconnect layer. In some embodiments, the second via structure is conductively connected to the second interconnect layer and extending to a top surface of the first semiconductor layer.

In some embodiments, dielectrics of the first and second bonding layers are bonded at the bonding interface.

In some embodiments, the semiconductor device further includes a third semiconductor structure above and bonded to the second semiconductor structure at a second bonding interface. The third semiconductor structure may include a pad-out interconnect layer above the second bonding interface.

In some embodiments, at the second bonding interface, the third semiconductor structure includes a third bonding layer having a plurality of third bonding contacts, the second semiconductor structure includes a fourth bonding layer having a plurality of fourth bonding contacts in contact with the plurality of third bonding contacts.

In some embodiments, the second via structure extends through the fourth bonding layer and to the second bonding interface.

In some embodiments, the third semiconductor structure further includes a third via structure conductively connected to the pad-out interconnect layer, extending through the second semiconductor layer, and in contact with the second via structure at the second bonding interface.

In some embodiments, sidewalls of the third via structure and the second via structure have a staggered profile at the second bonding interface.

In some embodiments, dielectrics of the third and fourth bonding layers are bonded at the second bonding interface.

In some embodiments, at least one of the first and second semiconductor structures includes a memory stack and a plurality of NAND memory strings extending vertically through the memory stack.

In some embodiments, at least one of the first and second semiconductor structures includes a memory stack and a plurality of NAND memory strings extending vertically through the memory stack. In some embodiments, the third semiconductor structure includes a peripheral circuit of the memory stack.

According to embodiments of the present disclosure, a 3D memory device includes a first semiconductor structure and a second semiconductor structure. The first semiconductor includes a first memory stack, a plurality of first NAND memory strings extending through the first memory stack, a first bonding layer having a plurality of first bonding contacts, and a first via structure extending vertically through the first bonding layer and into the first semiconductor structure. The second semiconductor structure includes a second memory stack, a plurality of second NAND memory strings extending through the first memory stack, a second bonding layer having a plurality of second bonding contacts, and a second via structure extending vertically through the second bonding layer and into the second semiconductor structure. The 3D memory device also includes a bonding interface between the first bonding layer and the second bonding layer. The first bonding contacts are in contact with the second bonding contacts at the bonding interface, and the first via structure is in contact with the second via structure and sidewalls of the first via structure and the second via structures have a staggered profile at the bonding interface.

In some embodiments, the first and second memory stacks are on opposite sides of the bonding interface.

In some embodiments, the first semiconductor structure includes a substrate, the first memory stack above the substrate, a first interconnect layer above the first memory stack, and the first bonding layer at the bonding interface and above the first memory stack. In some embodiments, the second semiconductor structure includes the second bonding layer at the bonding interface, the second interconnect layer above the second bonding layer, the second memory stack above the second interconnect layer, and a first semiconductor layer above the second memory stack.

In some embodiments, the first via structure is conductively connected to the first interconnect layer, and the second via structure is conductively connected to the second interconnect layer and extending to a top surface of the first semiconductor layer.

In some embodiments, dielectrics of the first and second bonding layers are bonded at the bonding interface.

In some embodiments, the 3D memory device further includes a third semiconductor structure above and bonded to the second semiconductor structure at a second bonding interface. The third semiconductor structure may include a peripheral circuit of at least one of the first and second memory stacks, and a pad-out interconnect layer above the peripheral circuit.

In some embodiments, at the second bonding interface, the third semiconductor structure includes a third bonding layer having a plurality of third bonding contacts, and the second semiconductor structure includes a fourth bonding layer having a plurality of fourth bonding contacts in contact with the plurality of third bonding contacts.

In some embodiments, the second via structure extends through the fourth bonding layer and to the second bonding interface.

In some embodiments, the third semiconductor structure further includes a third via structure conductively connected to the pad-out interconnect layer, extending through the second semiconductor layer, and in contact with the second via structure at the second bonding interface.

In some embodiments, sidewalls of the third via structure and the second via structure have a staggered profile at the second bonding interface.

In some embodiments, dielectrics of the third and fourth bonding layers are bonded at the bonding interface.

According to the embodiments of the present disclosure, a method for forming a semiconductor structure includes the following operations. First, a first semiconductor structure and a second semiconductor structure are formed. The first semiconductor structure includes a first via structure and a first bonding layer with a plurality of first bonding contacts, and the second semiconductor structure includes a portion of a second via structure and a second bonding layer with a plurality of second bonding contacts. The first and second bonding contacts are aligned to bond the first and second bonding contacts and the first via structure and the portion of the second via structure. The second semiconductor structure is thinned to expose the portion of the second via structure and form a semiconductor layer. A third semiconductor structure is bonded to the semiconductor layer. Further, a pad-out interconnect layer is formed on the third semiconductor structure.

In some embodiments, bonding the first and second bonding contacts and the first via structure and the portion of the second via structure includes bonding the first and second semiconductor structures in a face-to-face manner.

In some embodiments, the bonding of the first and second semiconductor structures and of the third and second semiconductor structures including hybrid bonding.

In some embodiments, forming the first semiconductor structure includes forming the first bonding layer above a first substrate and the first via structure extending vertically through the first bonding layer and above the first substrate. In some embodiments, forming the second semiconductor structure includes forming the second bonding layer above a second substrate and the portion of the second via structure extending vertically through the second bonding layer into the second substrate. In some embodiments, thinning the second semiconductor structure includes thinning the second substrate.

In some embodiments, the method further includes forming the third semiconductor structure before bonding the third semiconductor structure to the second semiconductor structure. Forming the third semiconductor structure includes forming a third bonding layer above a third substrate, the third bonding layer having a plurality of third bonding contacts. Forming the third semiconductor structure also includes forming a third via structure extending vertically through the third bonding layer and into the third substrate.

In some embodiments, the method further includes the following operations. A fourth bonding layer is formed above the semiconductor layer, the fourth bonding layer having a plurality of fourth bonding contacts. Another portion of the second via structure is formed extending through the fourth bonding layer and in contact with the portion of the second via structure, the portion and the other portion of the second via structure forming the second via structure. The third and fourth bonding contacts are aligned to bond the third semiconductor structure to the second semiconductor structure in a face-down manner such that the third bonding contacts are bonded with the fourth bonding contacts, and the third via structure is bonded with the second via structure. The third substrate is thinned to form a second semiconductor layer and expose the third via structure. The pad-out interconnect layer is formed above the second semiconductor layer and conductively connected to the third via structure.

In some embodiments, the plurality of bonding contacts and the via structure are formed in the same operations in the respective semiconductor structure.

In some embodiments, the method further includes forming a memory stack in at least one of the first and second semiconductor structures, the memory stack being between the respective substrate and a respective interconnect layer that is in contact with the respective bonding layer. In some embodiments, the method also includes forming a peripheral circuit of the memory stack above the third substrate and an interconnect layer under and in contact with the third boning layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor structure, comprising:
    forming a first semiconductor structure and a second semiconductor structure, the first semiconductor structure comprising a first via structure and a first bonding layer with a plurality of first bonding contacts, the second semiconductor structure comprising a portion of a second via structure and a second bonding layer with a plurality of second bonding contacts;
    aligning the first and second bonding contacts to bond the first and second bonding contacts and the first via structure and the portion of the second via structure;
    thinning the second semiconductor structure to expose the portion of the second via structure and form a semiconductor layer;
    bonding a third semiconductor structure to the semiconductor layer; and
    forming a pad-out interconnect layer on the third semiconductor structure.

2. The method of claim 1, wherein bonding the first and second bonding contacts and the first via structure and the portion of the second via structure comprises bonding the first and second semiconductor structures in a face-to-face manner.

3. The method of claim 2, wherein the bonding of the first and second semiconductor structures and of the third and second semiconductor structures comprise hybrid bonding.

4. The method of claim 2, wherein
forming the first semiconductor structure comprises forming the first bonding layer above a first substrate and the first via structure extending vertically through the first bonding layer and above the first substrate;
forming the second semiconductor structure comprises forming the second bonding layer above a second substrate and the portion of the second via structure extending vertically through the second bonding layer into the second substrate; and
thinning the second semiconductor structure comprises thinning the second substrate.

5. The method of claim 4, further comprising forming the third semiconductor structure before bonding the third semiconductor structure to the second semiconductor structure, wherein forming the third semiconductor structure comprises:
forming a third bonding layer above a third substrate, the third bonding layer comprising a plurality of third bonding contacts; and
forming a third via structure extending vertically through the third bonding layer and into the third substrate.

6. The method of claim 5, further comprising:
forming a fourth bonding layer above the semiconductor layer, the fourth bonding layer comprising a plurality of fourth bonding contacts;
forming another portion of the second via structure extending through the fourth bonding layer and in contact with the portion of the second via structure, the portion and the other portion of the second via structure forming the second via structure;
aligning the third and fourth bonding contacts to bond the third semiconductor structure to the second semiconductor structure in a face-down manner such that the third bonding contacts are bonded with the fourth bonding contacts, and the third via structure is bonded with the second via structure;
thinning the third substrate to form a second semiconductor layer and expose the third via structure; and
forming the pad-out interconnect layer above the second semiconductor layer and conductively connected to the third via structure.

7. The method of claim 1, wherein the plurality of bonding contacts and the via structure are formed in the same operations in the respective semiconductor structure.

8. The method of claim 5, further comprising:
forming a memory stack in at least one of the first and second semiconductor structures, the memory stack being between the respective substrate and a respective interconnect layer that is in contact with the respective bonding layer; and
forming a peripheral circuit of the memory stack above the third substrate and an interconnect layer under and in contact with the third boning layer.

9. The method of claim 1, wherein:
a portion of the second semiconductor structure covers the portion of second via structure; and
thinning the second semiconductor structure comprises removing the portion of the second semiconductor structure thin the second semiconductor structure to expose the portion of the second via structure and form the semiconductor layer.

10. The method of claim 9, wherein bonding the first and second bonding contacts and the first via structure and the portion of the second via structure comprises:
arranging the portion of the second semiconductor structure at a side away from the first bonding layer of the first semiconductor structure; and
bonding the first semiconductor structure and the second semiconductor structure in a face-to-face manner.

11. The method of claim 1, wherein bonding the first and second bonding contacts and the first via structure and the portion of the second via structure comprises bonding the first via structure and the portion of the second via structure to form sidewalls of the first via structure and the portion of the second via structure to have a staggered profile.

12. The method of claim 1, wherein forming the second semiconductor structure comprising forming the second bonding layer above a second substrate and the portion of the second via structure extending vertically through the second bonding layer into the second substrate.

13. The method of claim 12, wherein:
the portion of the second via structure is buried in the second substrate, and a portion of the second substrate covers the portion of the second via structure; and
thinning the second semiconductor structure comprises removing the portion of the second substrate to expose the portion of second via structure.

14. The method of claim 12, wherein a depth of the portion of the second via structure into the second substrate is determined according to the portion of the second substrate to be removed.

15. The method of claim 1, wherein each lateral dimension of the first via structure and the portion of the second via structure is greater than each lateral dimension of the first and second bonding contacts.

16. The method of claim 1, wherein the plurality of second bonding contacts and the portion of the second via structure are formed through same patterning and deposition processes.

17. A method for forming a semiconductor structure, comprising:
forming a first semiconductor structure comprising a first via structure and a first bonding layer with a plurality of first bonding contacts;
forming a second bonding layer above a substrate and a portion of a second via structure penetrating vertically through the second bonding layer and extending into the substrate to be covered by a portion of the substrate, thereby forming a second semiconductor structure, the second bonding layer comprising a plurality of second bonding contacts;
aligning the first bonding contacts with the second bonding contacts;
bonding the first bonding contacts with the second bonding contacts to align and bond the first via structure with the portion of the second via structure; and
thinning the substrate to expose the portion of the second via structure and form a semiconductor layer.

18. The method of claim 17, further comprising:
bonding a third semiconductor structure to the semiconductor layer; and
forming a pad-out interconnect layer above the third semiconductor structure.

19. The method of claim 17, wherein bonding the first bonding contacts with the second bonding contacts comprises bonding the first bonding contacts with the second bonding contacts to align and bond the first via structure with the portion of the second via structure, sidewalls of the first via structure and the portion of the second via structure, as bonded, having a staggered profile.

20. The method of claim 17, wherein each lateral dimension of the first via structure and the portion of the second via structure is greater than each lateral dimension of the first and second bonding contacts.

\* \* \* \* \*